(12) United States Patent
Tran et al.

(10) Patent No.: US 7,646,033 B2
(45) Date of Patent: Jan. 12, 2010

(54) SYSTEMS AND METHODS FOR PRODUCING WHITE-LIGHT LIGHT EMITTING DIODES

(75) Inventors: Chuong Anh Tran, Orange, CA (US); Trung Tri Doan, Los Gatos, CA (US)

(73) Assignee: SemiLEDs Corporation, Boise, ID (US)

( * ) Notice: Subject to any disclaimer, the term of this patent is extended or adjusted under 35 U.S.C. 154(b) by 0 days.

(21) Appl. No.: 11/692,015

(22) Filed: Mar. 27, 2007

(65) Prior Publication Data
US 2007/0228404 A1 Oct. 4, 2007

Related U.S. Application Data

(62) Division of application No. 11/032,853, filed on Jan. 11, 2005, now Pat. No. 7,195,944.

(51) Int. Cl.
*H01L 27/15* (2006.01)
*H01L 33/00* (2006.01)

(52) U.S. Cl. .................. 257/94; 257/99; 257/E33.012; 257/E33.03; 257/E33.049; 257/E33.061

(58) Field of Classification Search .................. 257/94, 257/E33.012, E33.03, E33.049, E33.061
See application file for complete search history.

(56) References Cited

U.S. PATENT DOCUMENTS

| | | | |
|---|---|---|---|
| 5,959,316 A | 9/1999 | Lowery | |
| 5,998,925 A | 12/1999 | Shimizu et al. | |
| 6,071,795 A | 6/2000 | Cheung et al. | |
| 6,221,683 B1 | 4/2001 | Nirschl et al. | |
| 6,417,019 B1 | 7/2002 | Mueller et al. | |
| 6,501,102 B2 | 12/2002 | Mueller-Mach et al. | |
| 6,576,488 B2 | 6/2003 | Collins, III et al. | |
| 6,641,448 B2 | 11/2003 | Wang et al. | |
| 6,642,652 B2* | 11/2003 | Collins et al. | 313/512 |
| 6,658,041 B2 | 12/2003 | Uebbing | |
| 6,734,466 B2 | 5/2004 | Chua | |
| 6,744,071 B2 | 6/2004 | Sano et al. | |
| 6,744,196 B1* | 6/2004 | Jeon | 313/498 |
| 6,770,542 B2 | 8/2004 | Plossl et al. | |
| 6,800,500 B2 | 10/2004 | Coman et al. | |
| 2004/0135158 A1 | 7/2004 | Hon | |
| 2004/0188696 A1* | 9/2004 | Hsing Chen et al. | 257/99 |
| 2004/0235210 A1 | 11/2004 | Tamura et al. | |
| 2004/0245543 A1 | 12/2004 | Yoo | |
| 2006/0091409 A1 | 5/2006 | Epler et al. | |

OTHER PUBLICATIONS

PCT International Search Report dated Oct. 2, 2007.

* cited by examiner

*Primary Examiner*—Lex Malsawma
(74) *Attorney, Agent, or Firm*—Patterson & Sheridan, LLP

(57) ABSTRACT

A vertical light emitting diode (LED) includes a metal substrate; a p-electrode coupled to the metal substrate; a p-contact coupled to the p-electrode; a p-GaN portion coupled to the p electrode; an active region coupled to the p-GaN portion; an n-GaN portion coupled to the active region; and a phosphor layer coupled to the n-GaN.

20 Claims, 5 Drawing Sheets

White Light Emitted from Chips

White Light Emitted from Chips

SYSTEMS AND METHODS FOR PRODUCING WHITE-LIGHT LIGHT EMITTING DIODES

CROSS-REFERENCE TO RELATED APPLICATION

This application is a divisional of U.S. patent application Ser. No. 11/032,853, filed Jan. 11, 2005 now U.S. Pat. No. 7,195,44, and is herein incorporated by reference.

The present invention generally relates to a light-emitting diode and a method for fabricating the same.

Advances in light emitting diode (LED) technology have resulted in LEDs with characteristics of small volume, light weight, high efficiency, and long life. These LEDs have seen great advances in different monochromatic color output, such as red, blue, and green. Single color LED's can be used as a backlight in a special display, for instance, mobile phones and light crystal displays (LCDs).

Recently, various attempts have been made to make white light sources by using light emitting diodes. Because the light emitting diode has a favorable emission spectrum to generate monochromatic light, making a light source for white light requires it to arrange three light emitting components of R, G and B closely to each other while diffusing and mixing the light emitted by them. When generating white light with such an arrangement, there has been such a problem that white light of the desired tone cannot be generated due to variations in the tone, luminance and other factors of the light emitting component. Also when the light emitting components are made of different materials, electric power required for driving differs from one light emitting diode to another, making it necessary to apply different voltages different light emitting components, which leads to complex drive circuit. Moreover, because the light emitting components are semiconductor light emitting components, color tone is subject to variation due to the difference in temperature characteristics, chronological changes and operating environment, or unevenness in color may be caused due to failure in uniformly mixing the light emitted by the light emitting components. Thus light emitting diodes are effective as light emitting devices for generating individual colors, although a satisfactory light source capable of emitting white light by using light emitting components has not been obtained so far.

U.S. Pat. No. 5,998,925 discloses a white light emitting diode having a light emitting component that uses a semiconductor as a light emitting layer and a phosphor which absorbs a part of light emitted by the light emitting component and emits light of wavelength different from that of the absorbed light, wherein the light emitting layer of the light emitting component is a nitride compound semiconductor and the phosphor contains garnet fluorescent material activated with cerium which contains at least one element selected from the group consisting of Y, Lu, Sc, La, Gd and Sm, and at least one element selected from the group consisting of Al, Ga and In and, is subject to less deterioration of emission characteristic even when used with high luminance for a long period of time.

FIG. 1 shows a lead type LED as disclosed in the '925 patent. The light emitting diode is a lead type light emitting diode having a mount lead 2 and an inner lead 4, wherein a light emitting component 8 is installed on a cup 6 of the mount lead 2, and the cup 6 is filled with a coating resin 14 which contains a specified phosphor to cover the light emitting component 8 and is molded in resin. An n electrode and a p electrode of the light emitting component 8 are connected to the mount lead 2 and the inner lead 4, respectively, by means of wires 12. In the light emitting diode constituted as described above, part of light emitted by the light emitting component (LED chip) 8 (hereinafter referred to as LED light) excites the phosphor contained in the coating resin 14 to generate fluorescent light having a wavelength different from that of LED light, so that the fluorescent light emitted by the phosphor and LED light which is output without contributing to the excitation of the phosphor are mixed and output. As a result, the light emitting diode also outputs light having a wavelength different from that of LED light emitted by the light emitting component 8.

FIG. 2 shows a chip embodiment as disclosed in the '925 patent. The chip type LED 26 is installed in a recess of a casing 22 which is filled with a coating material which contains a specified phosphor to form a coating 28. The light emitting component 26 is fixed by using an epoxy resin or the like which contains Ag, for example, and an n electrode and a p electrode of the light emitting component 26 are connected to metal terminals 20 installed on the casing 22 by means of conductive wires 24. In the chip type light emitting diode constituted as described above, similarly to the lead type light emitting diode of FIG. 1, fluorescent light emitted by the phosphor and LED light which is transmitted without being absorbed by the phosphor are mixed and output, so that the light emitting diode also outputs light having a wavelength different from that of LED light emitted by the light emitting component 26.

U.S. Pat. No. 6,642,652 discloses a light source that includes a light emitting device such as a III-nitride light emitting diode covered with a luminescent material structure, such as a single layer or multiple layers of phosphor. Any variations in the thickness of the luminescent material structure are less than or equal to 10% of the average thickness of the luminescent material structure. In some embodiments, the thickness of the luminescent material structure is less than 10% of a cross-sectional dimension of the light emitting device. In some embodiments, the luminescent material structure is the only luminescent material through which light emitted from the light emitting device passes. In some embodiments, the luminescent material structure is between about 15 and about 100 microns thick. The luminescent material structure is selectively deposited on the light emitting device by, for example, stenciling or electrophoretic deposition.

An LED coated with phosphor according to the '652 patent is illustrated in FIG. 3. The LED in FIG. 3 includes a n-type region 44 formed on a substrate 42, such as sapphire, SiC, or a III-nitride material. An active region 46 is formed on the n-type region 44, and a p-type region 36 is formed on the active region 46. N-type region 44, active region 46, and p-type region 36 are typically multiple-layer structures. A portion of the p-type region 36, the active region 46, and the n-type region 44 is etched away to expose a portion of n-type region 44. A p-type contact 34 is deposited on the p-type region 36 and an n-type contact 38 is deposited on the exposed portion of n-type region 44. The LED is then flipped over and mounted to a sub-mount 30 by a material 32 such as solder.

U.S. Pat. No. 6,744,196 discloses thin film LED devices comprised of LED chips that emit light at a first wavelength, and a tinted thin film layer over the LED chip that changes the color of the emitted light. For example, a blue-light emitting LED chip can be used to produce white light. The tinted thin film layer beneficially consists of ZnSe, $CeO_2$, $Al_2O_3$, or $Y_2O_3Ce$ that is deposited using a chemical vapor deposition process, such as metal organic chemical vapor deposition (MOCVD), atomic layer chemical vapor deposition (ALD), plasma enhanced MOCVD, plasma enhanced ALD, and/or photo enhanced CVD. As shown in FIG. 4, an N-contact 50 is positioned below a reflective layer 52. A tinted layer (a phosphor layer) 53 is positioned above the reflective layer 52. Next, a first passivation layer 54 is formed, and a p semi-transparent contact 56 is formed. A second passivation layer 58 is formed above the first passivation layer 54 and contact 56. A conductive wire 60 is connected to a p-pad 62, which is positioned above the p-lead 64.

SUMMARY

A vertical light emitting diode (LED) includes a metal substrate; a p-electrode coupled to the metal substrate; a p-GaN portion coupled to the p electrode; an active region coupled to the p-GaN portion; an n-GaN portion coupled to the active region; and a phosphor layer coupled to the n-GaN.

Implementations of the above LED can include one or more of the following. The metal substrate with a mirror layer is formed on top of the p-GaN portion; using laser lift-off (LLO), selective wet etching or chemical mechanical polishing, the sapphire carrier is removed. The p-contact can also be a light reflector. The phosphor layer can be spin-coated or screen printing with a phosphor powder or paste. The phosphor layer is patterned using a masking material 101 such as photo resist and dry etch using a fluorine containing plasma; then a metal layer Cr/Ni 99 such as Cr/Ni is applied to form a contact with n-GaN using various techniques such as PVD, ebeam evaporation or CVD; the metal bond pad 98 is formed a contact with n-GaN after the resist 101 is removed and lift-off the unwanted areas of metal 99 to form bond pad 98. This is called resist lift-off techniques. The phosphor layer and the bond pad cover the exposed n-GaN surface 80.

Advantage of the invention may include one or more of the following. The above LED wafer surface with exposed n-GaN portion 80 layer is substantial smooth, planar surface for subsequent process. The method lowers the cost of producing white LED by coating the phosphor on the blue LEDs at wafer level directly on top of exposed n-GaN surface as comparing to conventional one LED die at a time. The method reduces the amount of phosphor needed for each die by cover only the exposed n-GaN surface. The LEDs do not require wafer bonding or gluing and the complex and lengthy and one at a time wafer bonding/gluing process is replaced by a less complex deposition process for example physical vapor deposition (PVD), chemical vapor deposition (CVD), plasma enhanced CVD (PECVD), evaporation, ion beam deposition, electro chemical deposition, electroless chemical deposition, plasma spray, or ink jet deposition. No semi-transparent contact is needed for the n-electrode since n-GaN conductivity is good, and as a result, more light output can be emitted from the LED device. Further, since only one electrode is needed on each side of the device, the LED electrode obstructs less light. Additionally, current can spread out uniformly from n-electrode to p-electrode, thus increasing LED performance. Moreover, the metal substrate can dissipate more heat than the sapphire substrate, so more current can be used to drive the LED. The resulting LED can replace the conventional LED at a smaller size. For the same LED size, the light output from vertical LED is significantly higher than the conventional LED for the same drive current.

BRIEF DESCRIPTION OF THE DRAWINGS

To better understand the other features, technical concepts and objects of the present invention, one may clearly read the description of the following embodiments and the accompanying drawings, in which.

DESCRIPTION

Next, with reference to the accompanying drawings, embodiments of the present invention will be described. In reading the detailed description, the accompanying drawings may be referenced at the same time and considered as part of the detailed description.

Figure 1:
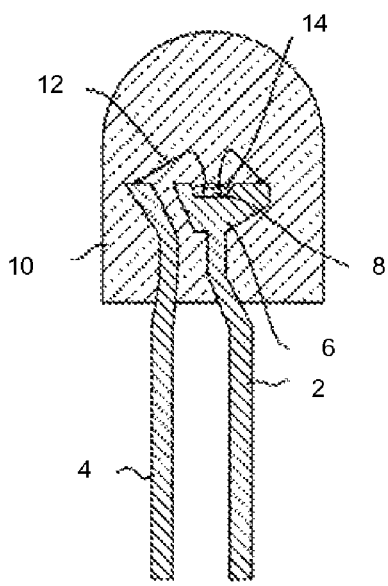
FIGS. 1-4 show various prior art LEDs.
Figure 2:
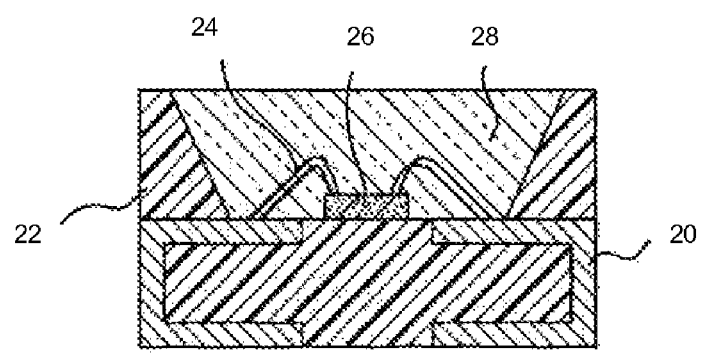
Figure 3:
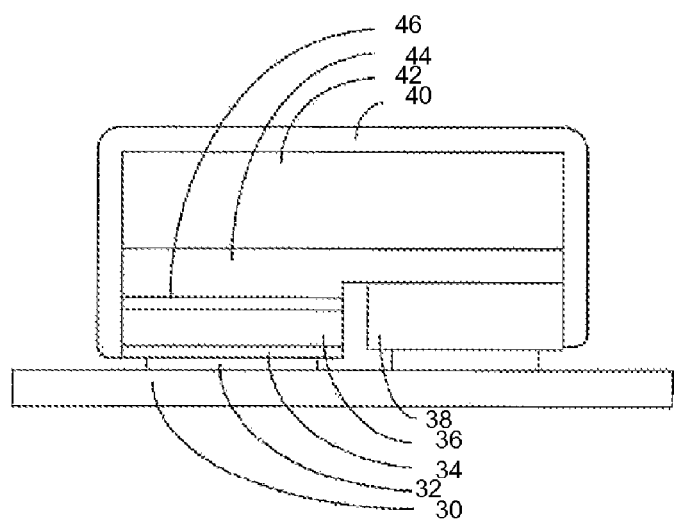
Figure 4:
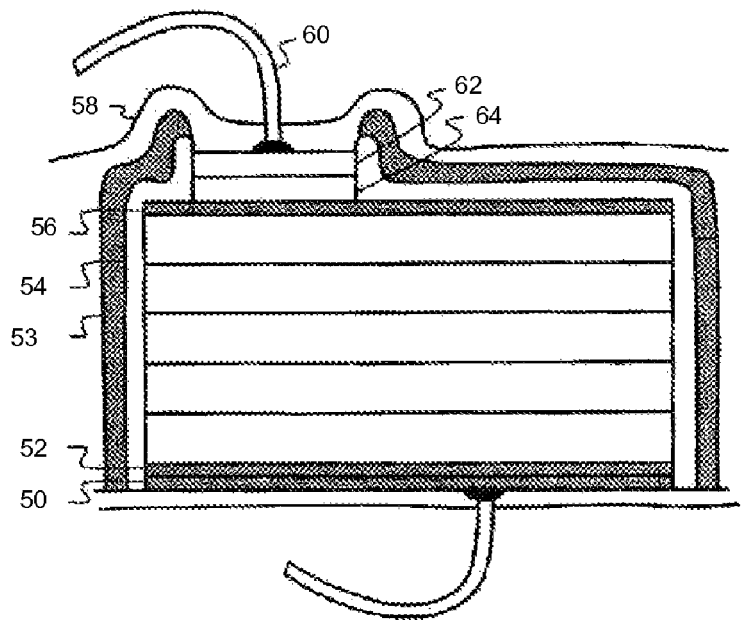
Figure 5:
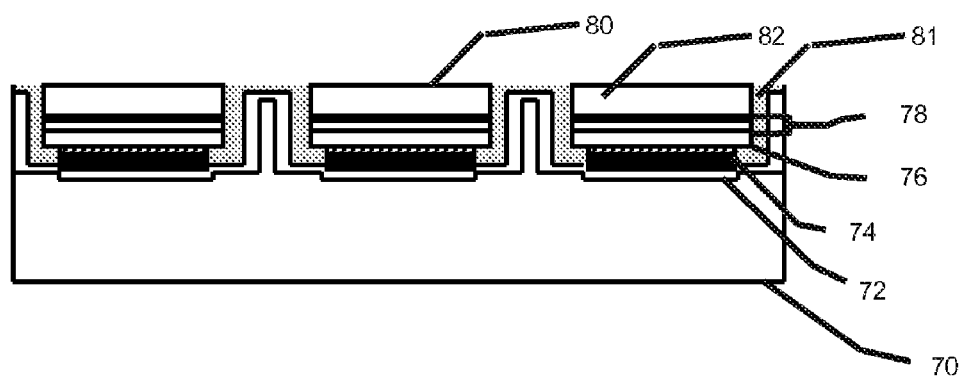
FIG. 5 shows a first embodiment of a vertical LED in accordance with one embodiment of the invention.

FIG. 5 shows an exemplary structure of one embodiment of a vertical-LED wafer. Each LED includes a metal substrate 70 made from a laser lift-off process. A p electrode 72 is positioned above the metal substrate 70. Next, a light reflector and p-contact 74 and a p-GaN portion 76 are positioned above the p electrode 72. An active region 78 (including a multi-quantum well) is formed, and an n-GaN portion 82 is formed above the active region 78; the n-GaN has an exposed surface 80.

The LED is formed by depositing a multilayer epitaxial structure above a carrier substrate such as sapphire; depositing at least one metal layer above the multilayer epitaxial structure; and removing the carrier substrate to leave the metal substrate 70. The metal layer can be deposited using Electro chemical deposition, electroless chemical deposition, CVD chemical vapor deposition, MOCVD Metal Organic CVD, PECVD Plasma enhanced CVD, ALD Atomic layer deposition, PVD Physical vapor deposition, evaporation, or plasma spray, or the combination of these techniques. The metal layer can be single or multi-layered. In one embodiment, Ag/Pt or Ag/Pd or Ag/Cr is used as a mirror layer, Ni is used as a barrier for Gold as a seed layer for copper plating which is used as the bulk substrate. The mirror layer (Ag, Al, Pt, Ti, Cr for example) is deposited and then a barrier layer such as TiN, TaN, TiWN, TiW with oxygen is formed above the mirror layer before electro or electroless chemical deposition of a metal such as Ni or Cu. For electrochemical deposition of copper, a seed layer is deposited using CVD, MOCVD, PVD, ALD, or evaporation process; some of the seed materials for Copper are W, Au, Cu or Ni, among others. The metal layers could have same or different composition and deposited using various deposition techniques. The carrier substrate removal can be done using laser, etching, grinding/lapping or chemical mechanical polishing or wet etching, among others.

The sapphire substrate can be removed using laser lift-off (LLO) technique. The multilayer epitaxial layer can have a reflective metal layer coupled to the metal plating layer; a passivation layer 81 is passivating the sidewall of the LED dies, coupled to the reflective metal layer 74, p-electrode 72, p-GaN 76, MQW 78, and n-GaN 82; a p-GaN layer coupled to the passivation layer; a n-GaN layer coupled to the MQW layer; an n-electrode coupled to the n-GaN layer; and the metal plating layer is a p-electrode or having a p-electrode coupled to the metal plating layer.

Figure 6:
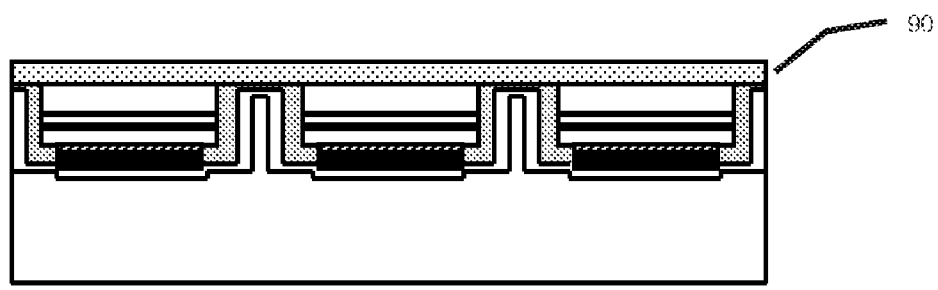
FIG. 6 shows the LED of FIG. 5 with a phosphor coating thereon.

FIG. 6 shows phosphor coating 90 on the vertical-LED. Since the LED wafer is substantial smooth and planar, the wafer-level phosphor coating is uniform and parallel to the emitting LED surface 80, colorful rings do not exist on the LED's field pattern because the blue light emitted from the active layers travels the same distance or light paths through the phosphor layer. In addition, the LED thickness (GaN layer total thickness is about 2 um to 8 um) is much smaller by the emitting surface 82 (greater than 50 um). Light is mainly emitted from the top surface, and a few come from the sidewall to minimize issues arising from uneven thickness of the phosphor layer 90.

The phosphor layer 90 can be formed using a spin coater. The phosphor layer 90 can be coated by the spin-coater spinning between 500 to 30000 rpm to control the layer thickness on the n-side-up vertical-LED wafer. In addition to the spin coat method, other methods such as the screen printing, roller method, or dipping method can be used. In particular, to obtain a predetermined equal film thickness, the spin coat method is preferably used. After the phosphor is coated on the substrate, the coated film is dried. The drying method is not limited as long as moisture of the film is evaporated. Thus, various methods using a heater or dried air or surface treatment such as a radiant heat lamp can be used. Alternatively, the coated film may be dried by leaving it in a room temperature environment for a long time.

To make the phosphor coating, a phosphor powder composition is prepared. For this purpose, for example, a dispersing agent is dispersed in purified water, and the dispersion is stirred with a homomixer and placed in the purified water in which the dispersing agent has been dispersed, and the mixture is stirred. In the phosphor powder composition, water can be used as a dispersing medium. The phosphor powder composition may contain alcohol as a dispersing agent or a retaining agent, and ammonium bi-chromate may be used as a photosensitive polymer. The phosphor powders may be surface-treated on their manufacturing process, for improving the dispersing property and adhesion thereof. The Phosphor coating material is composed by the phosphor elements mixed in organic chemicals such as alcohol, aerosol, binder material or resin epoxy to tune the viscosity of the coating material. The thickness can be tuned by the material viscosity and spin rate reproducibly to change the resulting CIE coordination of the white light LEDs. Next, a photoresist layer 101 is applied and exposed with a contact pattern, then the phosphor layer 90 is etched. The etching can include a dry etching method.

Figure 7:
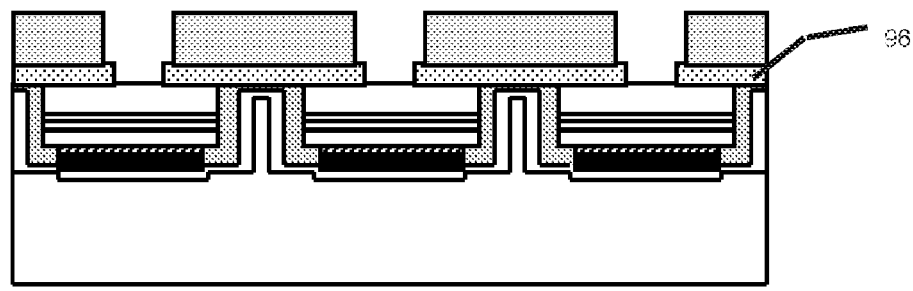
FIG. 7 shows patterned phosphor coating with photo resist masking layer.

FIG. 7 shows patterned phosphor layer with a masking photo resist masking layer. A patterned phosphor layer 96 is formed on the exposed n-GaN surface 80. The patterned phosphor layer 96 can be patterned using a dry etching process. In the dry etching process, a photoresistive mask is placed over the phosphor thin films and exposing the thin films to a corrosive gas within an electric field. The mask can include photoresistive strips corresponding to the dimensions of the phosphor segments. The result of the etching is a plurality of openings for a contact opening for later depositing a contact metal layer 99 such as Ni/Cr (Ni is in contact with n-GaN).

Figure 8:
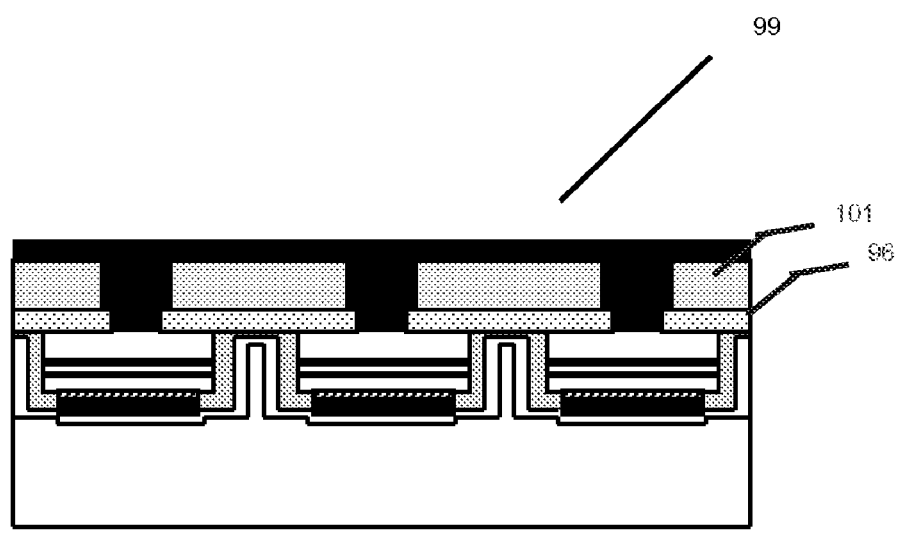
FIG. 8 shows metal contact layer deposited on the patterned phosphor coating of FIG. 7.
Figure 9:
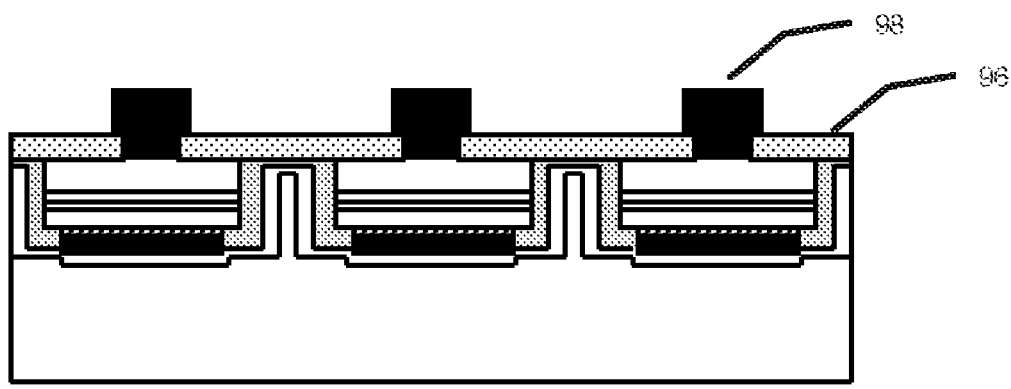
FIG. 9 shows patterned metal bond pads and phosphor coating covering the LED wafer.

In FIG. 8, a contact metal layer 99 such as Ni/Cr (Ni is in contact with n-GaN) is deposited on top of the photoresist masking layer, couple with phosphor layer 96 and in contact with n-GaN 80. Metal layer 99 can be deposited using CVD, PVP or ebeam evaporation.

In FIG. 8, a bonding pad 98 is formed above the patterned phosphor layer 96 to form an n-pad. The bond pad metal 98 is formed by lift-off techniques during the removal of the photoresist masking layer 101 using an aqueous solution such as diluted KOH. The process for phosphor coating and bonding pad can be exchanged, wherein the n-GaN contact metal 99 is patterned, dry etched and protected first by a photoresist masking layer before the phosphor layer 96 is applied and patterned by lift-off technique during the removal of the photoresist masking layer protecting the bond pad 98 using an aqueous solution, such as diluted KOH.

Figure 10:
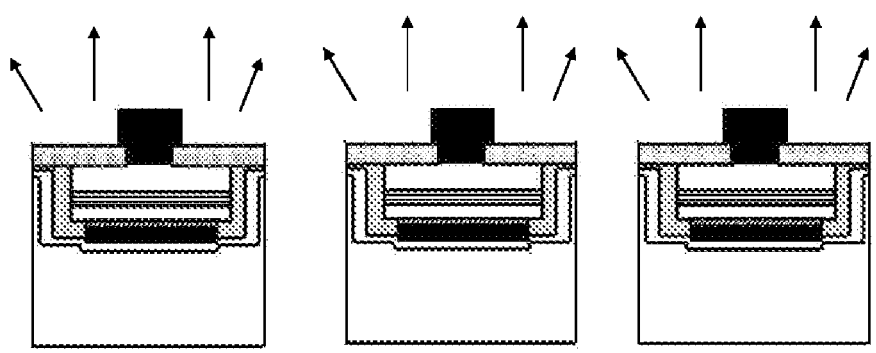
FIG. 10 shows a plurality of the phosphor coated LEDs.

FIG. 10 shows a plurality of white LED chips. The phosphor coated LED wafer is diced into white chips, which can be packaged directly without phosphor addition on the chip level. The phosphor coating is integrated into the n-side-up vertical LED of wafer-level process. Then the white-light wafer is diced into separated white-LED chips by laser or saw.

Although a single phosphor layer is described above, multiple phosphor layers can be used. For example, a red photosensitive phosphor powder composition (phosphor slurry) can be applied to the entire surface, exposed to light and developed, then, a green photosensitive phosphor powder composition (phosphor slurry) can be applied to the entire surface, exposed to light and developed, and then a blue photosensitive phosphor powder composition (phosphor slurry) is applied to the entire surface, exposed to light and developed.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A vertical light-emitting diode (LED) structure, comprising:
   a metal substrate deposited adjacent to a p-electrode;
   a p-GaN layer disposed above the p-electrode;
   an active region for emitting light disposed above the p-GaN layer;
   an n-GaN layer disposed above the active region; and
   a wafer-level phosphor layer and an n-electrode disposed above the n-GaN layer, wherein the phosphor layer is parallel to the n-GaN layer.

2. The LED structure of claim 1, wherein the metal substrate is deposited using at least one of electrochemical plating, electroless chemical plating, sputtering, chemical vapor deposition, e-beam evaporation, and thermal spray.

3. The LED structure of claim 1, wherein the metal substrate comprises at least one of copper, nickel, aluminum, and alloys thereof.

4. The LED structure of claim 1, further comprising a p-contact interposed between the metal substrate and the p-GaN layer, wherein the p-contact comprises a light reflector.

5. The LED structure of claim 1, wherein the phosphor layer is spin-coated.

6. The LED structure of claim 5, wherein the phosphor layer comprises a phosphor powder composition spin-coated on the n-GaN layer.

7. The LED structure of claim 6, wherein the phosphor powder composition comprises phosphor particles mixed with one or more organic chemicals.

8. The LED structure of claim 1, wherein the phosphor layer is patterned.

9. The LED structure of claim 1, wherein the phosphor layer is dry-etched.

10. The LED structure of claim 1, wherein the n-electrode is a metal bond pad coupled to the n-GaN layer through the phosphor layer.

11. The LED structure of claim 1, wherein the phosphor layer contacts a surface of the n-GaN layer.

12. The LED structure of claim 11, wherein the surface of the n-GaN layer is substantially smooth and planar.

13. The LED structure of claim 1, wherein the thickness of the phosphor layer is substantially uniform.

14. A vertical light-emitting diode (LED) structure, comprising:
- a metal substrate deposited adjacent to a p-electrode;
- a p-GaN layer disposed above the p-electrode;
- an active region for emitting light disposed above the p-GaN layer;
- an n-GaN layer disposed above the active region;
- a first wafer-level phosphor layer and an n-electrode disposed above the n-GaN layer, wherein the first phosphor layer is parallel to the n-GaN layer; and
- a second phosphor layer coupled to the first phosphor layer.

15. The LED structure of claim 14, wherein at least one of the first and the second phosphor layers is patterned.

16. The LED structure of claim 14, wherein the surface of the n-GaN layer is substantially smooth and planar.

17. The LED structure of claim 14, wherein the thickness of the first phosphor layer is substantially uniform.

18. The LED structure of claim 17, wherein the thickness of the second phosphor layer is substantially uniform.

19. LED structure of claim 14, wherein the metal substrate is deposited using at least one of electrochemical plating, electroless chemical plating, sputtering, chemical vapor deposition, e-beam evaporation, and thermal spray.

20. A vertical light-emitting diode (LED) structure, comprising:
- a metal substrate deposited adjacent to a p-electrode;
- a p-GaN layer disposed above the p-electrode;
- an active region for emitting light disposed above the p-GaN layer;
- an n-GaN layer disposed above the active region;
- a first wafer-level phosphor layer and an n-electrode disposed above the n-GaN layer, wherein the first phosphor layer is parallel to the n-GaN layer; and
- a second phosphor layer coupled to the first phosphor layer, wherein the first phosphor layer has a phosphor composition that is photosensitive to a different color than a phosphor composition of the second phosphor layer.

* * * * *